(12) United States Patent
Raposas et al.

(10) Patent No.: US 10,770,377 B2
(45) Date of Patent: Sep. 8, 2020

(54) LEADFRAME DIE PAD WITH PARTIALLY-ETCHED GROOVE BETWEEN THROUGH-HOLE SLOTS

(71) Applicant: Texas Instruments Incorporated, Dallas, TX (US)

(72) Inventors: Joel De Guzman Raposas, Bulacan (PH); Rolando Mendoza Chan, Pampanga (PH); Kent Lacson Capan, Pampanga (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/237,290

(22) Filed: Dec. 31, 2018

(65) Prior Publication Data

US 2020/0211933 A1 Jul. 2, 2020

(51) Int. Cl.
*H01L 23/495* (2006.01)
*H01L 23/31* (2006.01)
(Continued)

(52) U.S. Cl.
CPC .... *H01L 23/49541* (2013.01); *H01L 21/4828* (2013.01); *H01L 21/565* (2013.01); *H01L 23/3107* (2013.01); *H01L 23/49503* (2013.01); *H01L 24/48* (2013.01); *H01L 24/49* (2013.01); *H01L 2224/48091* (2013.01); *H01L 2224/48247* (2013.01); *H01L 2224/48257* (2013.01); *H01L 2224/49171* (2013.01); *H01L 2924/14* (2013.01)

(58) Field of Classification Search
CPC ......... H01L 23/49541; H01L 23/49503; H01L 23/3107; H01L 24/49; H01L 24/48; H01L 21/4828; H01L 21/565

USPC ....... 257/666, 667, 669, 670, 676, 690, 787, 257/E23.031, E23.037, E23.04, E23.046, 257/E23.124, E21.502, E21.506, E21.51, 257/E21.519; 438/111, 11, 118, 122
See application file for complete search history.

(56) References Cited

U.S. PATENT DOCUMENTS 7,446,397 B2 * 11/2008 Gai ..................... H01L 23/3107
257/667
7,838,974 B2 * 11/2010 Poddar .............. H01L 23/49503
257/676

(Continued)

OTHER PUBLICATIONS

Martin Burmeister, et al., "Preventing Adhesive Resin Bleed in Microelectronics Assembly Through Gas Plasma Technology", Tech Paper #60, 2013, https://www.epotek.com/site/technical-material/technical-material.html.

*Primary Examiner* — Dao H Nguyen
(74) *Attorney, Agent, or Firm* — Ronald O. Neerings; Charles A. Brill; Frank D. Cimino

(57) ABSTRACT

A leadframe includes a die pad for mounting a semiconductor die with its top side facing up using a die attach resin material including a resin, the leadframe having leads or lead terminals beyond the die pad. The die pad includes slots including a first slot and at least a second slot on at least a first side of the die pad that penetrate a full thickness of the die pad. At least one non-penetrating groove is in the die pad for providing a fluid connection including between the first and second slots for providing a flow channel for guiding the resin when received by the grooves after bleeding out from under the semiconductor die to flow to at least one of the first slot and the second slot.

24 Claims, 7 Drawing Sheets

(51) Int. Cl.
    *H01L 21/48*           (2006.01)
    *H01L 21/56*           (2006.01)
    *H01L 23/00*           (2006.01)

(56) References Cited

U.S. PATENT DOCUMENTS

| | | | |
|---|---|---|---|
| 8,643,156 B2 | 2/2014 | Qiu et al. | |
| 2002/0163015 A1* | 11/2002 | Lee | H01L 23/3107 |
| | | | 257/200 |
| 2007/0178630 A1* | 8/2007 | Huang | H01L 27/14618 |
| | | | 438/116 |
| 2009/0072367 A1* | 3/2009 | Poddar | H01L 23/49503 |
| | | | 257/676 |
| 2011/0193208 A1* | 8/2011 | Xue | H01L 24/37 |
| | | | 257/676 |
| 2014/0191380 A1* | 7/2014 | Lee | H01L 24/97 |
| | | | 257/676 |
| 2019/0267310 A1* | 8/2019 | Rodriguez | H01L 23/562 |

* cited by examiner

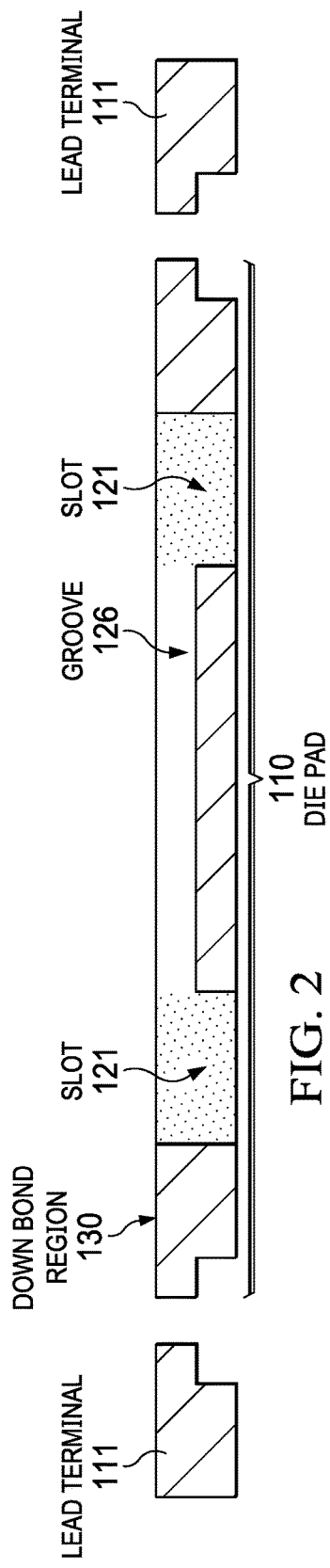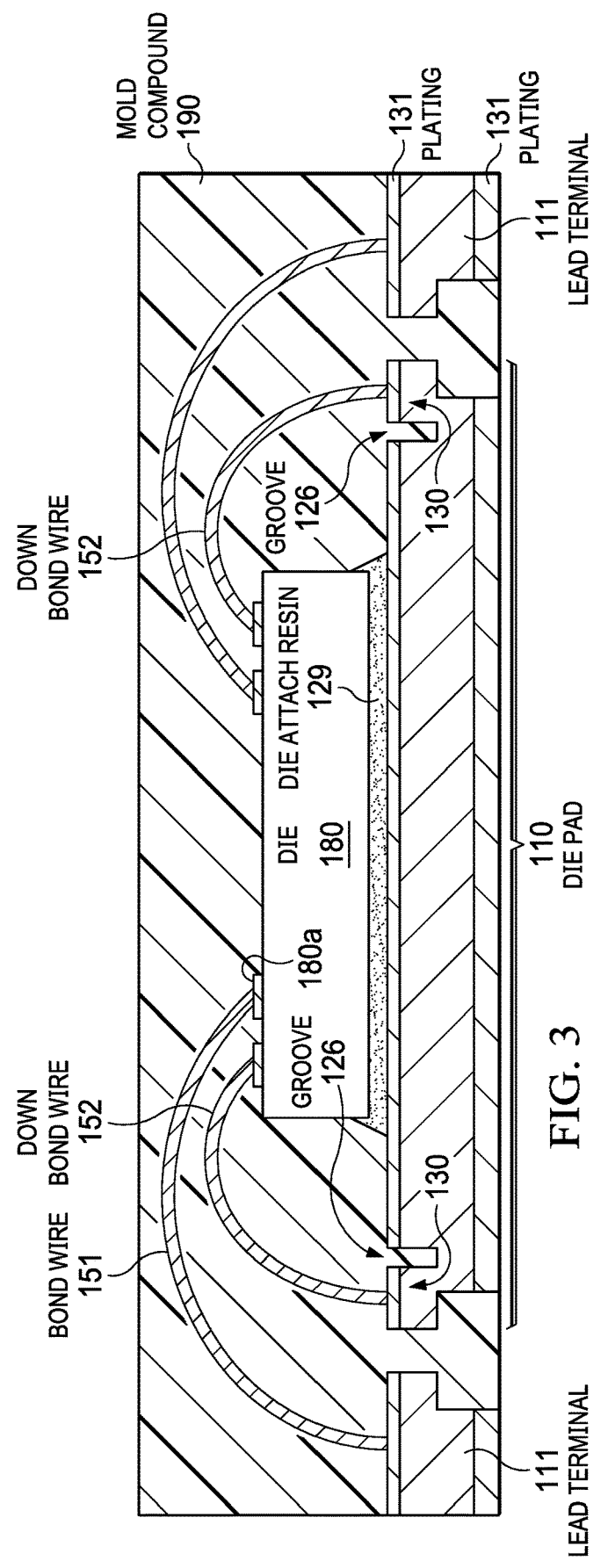

LEADFRAME DIE PAD WITH PARTIALLY-ETCHED GROOVE BETWEEN THROUGH-HOLE SLOTS

FIELD

This Disclosure relates to semiconductor packaging, more particularly to leadframe die pads having through-hole slots.

BACKGROUND

A variety of semiconductor chip packages are known that provide support for a semiconductor die, such as an integrated circuit (IC) die, and associated bond wires, provide protection from the environment, and enable surface mounting of the die to and interconnection with a printed circuit board (PCB). One conventional package configuration includes a leadframe having a die pad, and leads or lead terminals that mounts a semiconductor die top side up on the die pad. A die attach resin material (or paste) including a resin attaches the back side of the semiconductor die to the die pad which generally includes an epoxy-based resin, curing agent, catalyst, filler and one or more additives. Once the semiconductor die is attached to the die pad by the die attach resin, the assembly is usually cured, such as using ultraviolet light or oven curing, where the curing comprises crosslinking based on a material-specific thermal profile. The bond pads connected to active circuitry on the top side of the die are then wire bonded to the leads or lead terminals. After wire bonding, the die and leads or lead terminals are encapsulated in a mold compound such as a plastic material to form a semiconductor chip package generally leaving only the outer frame and the undersides of the leads or lead terminals exposed, with an option for an exposed die pad. After molding, the semiconductor chip packages are then cut from the outer frame (singulated).

One of the common issues encountered during semiconductor package assembly is referred to as resin bleed-out (RBO), or epoxy bleed-out (EBO), referred to herein as "resin bleed-out". Resin bleed-out is the separation and movement of some of the components of the die attach resin material from the bulk material that is applied to the die pad. Depending on die attach resin material formulation and leadframe surface chemistry and morphology, resin bleed-out components can be solvents, reactive diluents, low-molecular-weight resins, catalysts, and additives such as an adhesion promoter. Resin bleed-out tends to occur on high energy surfaces that includes metal leadframe surfaces which lack an organic coating. Resin bleed-out can cause a variety of device problems, including the dielectric coating of the leads or lead terminals that prevents a proper connection to be made, and bond wire adhesion problems to the leads or lead terminals.

There are several known approaches for controlling resin bleed-out. These approaches include modifying the formulation by including an anti-bleeding agent, using a die attach film (DAF) or a B-stage epoxy material, controlling the leadframe surface roughness, creating a mechanical barrier, and lowering the surface energy of leadframes by a generally adding an organic surface coating.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes the packaging of semiconductor devices with a relatively large semiconductor die size relative to its die pad of a leadframe with a die attach resin material that generally includes other components besides resin, where the semiconductor die that may have as little as a 0.5 mm clearance from the outer edge of die pad, is challenging using die attach resin material (e.g., an epoxy resin) due to resin bleed-out. Even more challenging for the packaging of such semiconductor devices is when there is a down bond(s) that is usually a ground bond. As known in the art, a down bond (sometimes called a substrate connection), is a bond wire from bond pads on the top side of the semiconductor die to the die pad lateral to the semiconductor die, where the die pad is generally an exposed die pad for providing improved thermal performance or a ground connection. Packaged device failures such as open circuit connections can arise when resin bleed-out reaches the areas of the die pad used for a down bond implemented during wirebond processing.

Disclosed aspects include a leadframe that includes a die pad for mounting a semiconductor die with its top side facing up using a die attach resin material including a resin, the leadframe having leads or leads terminals beyond the die pad. The die pad includes slots including a first slot and at least a second slot on at least a first side of the die pad that penetrate a full thickness of the die pad. At least one non-penetrating groove (i.e., a partially etched groove) is in the die pad for providing a fluid connection including between the first and second slots for providing a flow channel for guiding the resin when received by the grooves after bleeding out from under the semiconductor die to flow to first slot and/or the second slot.

BRIEF DESCRIPTION OF THE DRAWINGS

Reference will now be made to the accompanying drawings, which are not necessarily drawn to scale, wherein:

FIG. 2 is a cross-sectional view of the example leadframe shown in FIG. 1 along the cut-line A-A' showing a groove between first and second slots.

FIG. 3 is a cross-sectional view of the example leadframe shown in FIG. 1 along the cut-line B-B' through grooves that further includes a semiconductor die attached to the die pad that has its bond pads wire bonded to the leads or lead terminals of the leadframe including a down bond to the down bond region of the die pad.

DETAILED DESCRIPTION

Figure 1:
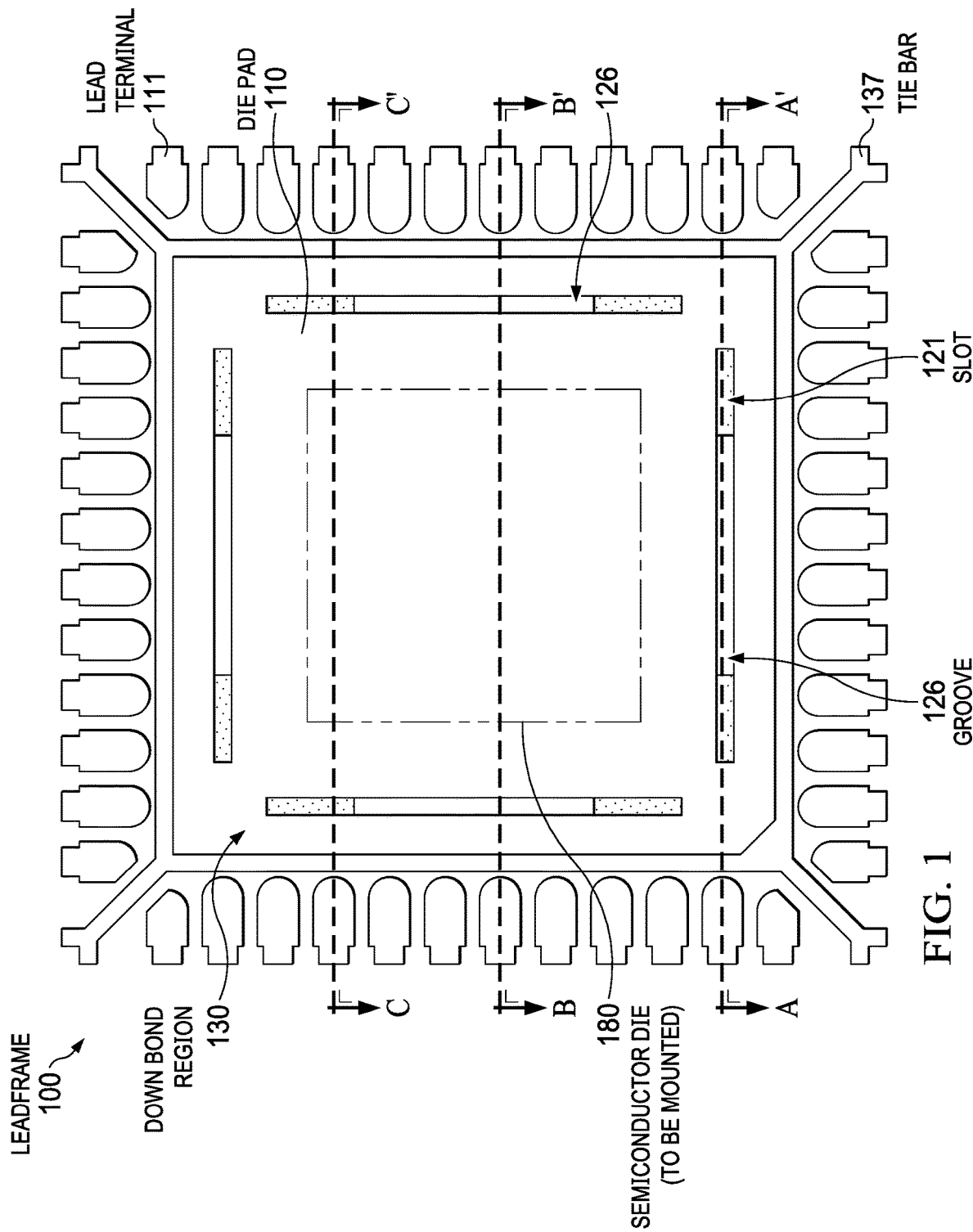
FIG. 1 is a top view depiction of an example quad flat no lead (QFN) leadframe having a die pad and lead terminals with through-hole slots and partially-etched grooves fluidically coupled to the slots shown between adjacent slots, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

This Disclosure recognizes resin bleed-out die from a die attach resin material continues to be a challenge in IC package assembly which involves movement of resin bleed-out material laterally away from the die bonding area under the die over time. Resin bleed-out can occur after the resin cure process, and before or after the wirebond process. The material of resin bleed-out can create a dielectric barrier on top of the bonding area of a leadframe that can minimize or inhibit electrical contact of the bond wire to the leadframe surface and also prevent the formation of a weld connection between the down bond and leadframe. After down bonding, resin bleed-out can still continue to occur to move resin if no barrier is created, and can potentially be a reliability issue as it can also inhibit adhesion of the mold compound on the leadframe surface.

A concept in this Disclosure is based on a waterway's drainage system. A disclosed non-penetrating groove (i.e., a partially etched groove), which is positioned between disclosed through-hole slots, serves as the leading canal to guide the resin bleed-out material to flow to the slots that serve as collecting ponds. Disclosed grooves and slots can be formed by an etching or by a stamping process, so that 'partially etched' (e.g., half-etched) in the case of disclosed grooves refers to the groove's thickness, not its process of formation. The level (height) of the slot being a through-hole slot is lower than the level of the groove being partially etched so that it is recognized that gravity can force and thus lead the resin bleed-out material towards the slots. Through this movement of resin bleed-out material received by the groove to the slot, the groove does not get saturated thereby preventing the resin bleed-out material from crossing the grooves and reaching the down bonding areas where it can cause down bond assembly problems.

FIG. 1 is a top view depiction of an example QFN leadframe 100 shown as a 48 pin leadframe having a die pad 110 and lead terminals 111 with through-hole slots (slots) 121 and on each side a non-penetrating groove 126 fluidically coupled to the slots shown between adjacent slots 121, according to an example aspect. The grooves are generally 20% to 80% etched depending on leadframe supplier capability, such as nominally being half-etched. Although each of the 4 sides of the leadframe 100 are shown having a groove 126 between slots 121, more generally there can be at least one side of the package having a groove 126 between slots 121. Moreover, the side(s) having a groove and slots can have 2 or more grooves each between slots. This Disclosure is also not only applicable to leadless packages such the QFN shown in FIG. 1, but also all packages with an exposed die pad including leaded packages, and for generally any number of leads or lead terminals (or pins). Tie bars are shown as 137.

A down bond region 130 is identified in FIG. 1. The groove 126 between slots 121 functions to channel resin bleed-out originating from under the semiconductor die 180 flowing out from the top side of the leadframe 100 so that the resin bleed-out does not to reach the down bond region 130 which as described above can cause bond wire adhesion failures or connection problems. The rectangular dashed line shown over the die pad 110 represents the outer edge of a semiconductor die 180 that is to be mounted top side up on the die pad 110 using a die attach resin material including a resin. There are cut-lines shown as A-A', B-B', and C-C' which are described below relative to FIG. 2, FIG. 3 and FIG. 4, respectively.

Figure 4:
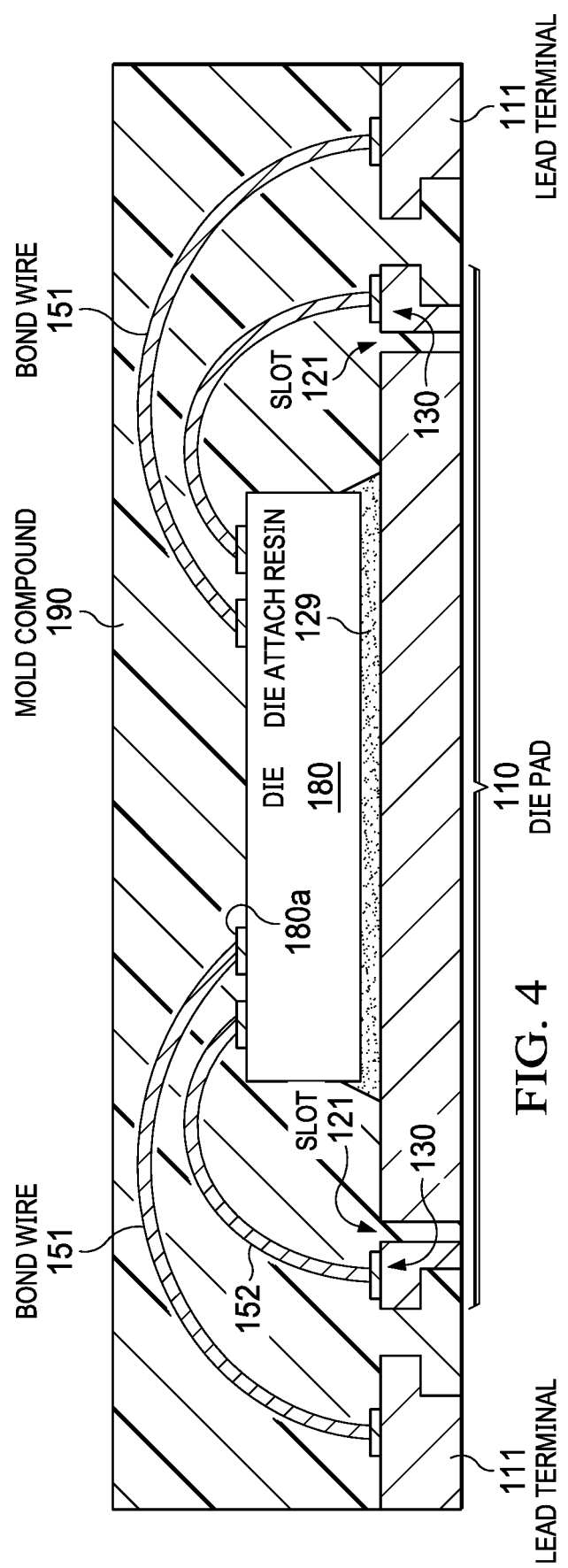
FIG. 4 is a cross-sectional view of the example leadframe shown in FIG. 1 along the cut-line C-C' through slots that further includes a semiconductor die attached to the die pad that has its bond pads wire bonded to the leads or lead terminals of the leadframe including a down bond to the down bond region of the die pad.

A wire bonding problem can occur if resin bleed-out reaches down bond region 130 for which stitch bonds are generally made as shown in FIG. 2 to FIG. 4. In most cases, the down bond region 130 that is affected results in short tail assist with no tail formed, which can result in machine stoppage and/or unit scrappage. As known in the art the wire bonding process generally follows a conventional six step cycle. Short tail issues can occur on the last step when a short tail or no tail wire is formed due to non-adhesion of the tail bond because of the resin bleed-out reaching the down bond region 130. In worst cases, the result may also be non-adhesion of the stitch or non-stick-on-lead (NSOL) bonding failures leading to unit scrap.

FIG. 2 is a cross-sectional view of the example leadframe shown in FIG. 1 along the cut-line A-A' showing a groove 126 between first and second slots 121. The slots 121 can be seen to be deeper as compared to the groove 126. Following the concept of water drainage previously mentioned, the slots 121 serve as collecting ponds of resin bleed material while the groove 126 serve as a trapper and a leading canal.

FIG. 3 is a cross sectional view of the example leadframe shown in FIG. 1 along the cut-line B-B' through grooves 126 that further includes a semiconductor die 180 having bond pads 180a on its active top side with its bottom side attached to the die pad 110, where the semiconductor die 180 has its bond pads 180a wire bonded to the leads or lead terminals 111 of the leadframe including a down bond wire 152 to the down bond region 130 of the die pad 110, and a bond wire 151 from a bond pad 180a to a lead terminal 111 of the package. The number of down bonds generally depending on the particular die requirement but is typically limited to the available space in the down bond region 130 located between an outer edge of the semiconductor die 180 and outer edge of the die pad 110. The die attach resin material 129 can comprise an epoxy material, such as a silver filled epoxy. The leadframe can include the optional plating 131 shown, such as NiPd plating. Mold compound 190 is shown configured to expose a bottom side of the die pad 110 to provide an exposed die pad.

FIG. 4 is a cross sectional view of the example leadframe shown in FIG. 1 along the cut-line C-C' through the slots 121 that further includes a semiconductor die 180 attached to the die pad 110, where the semiconductor die 180 has its bond pads 180a wire bonded to the leads or lead terminals 111 of the leadframe including a down bond wire 152 to the down bond region 130 of the die pad 110 again located between an outer edge of the semiconductor die 180 and outer edge of the die pad 110.

Figure 5A:
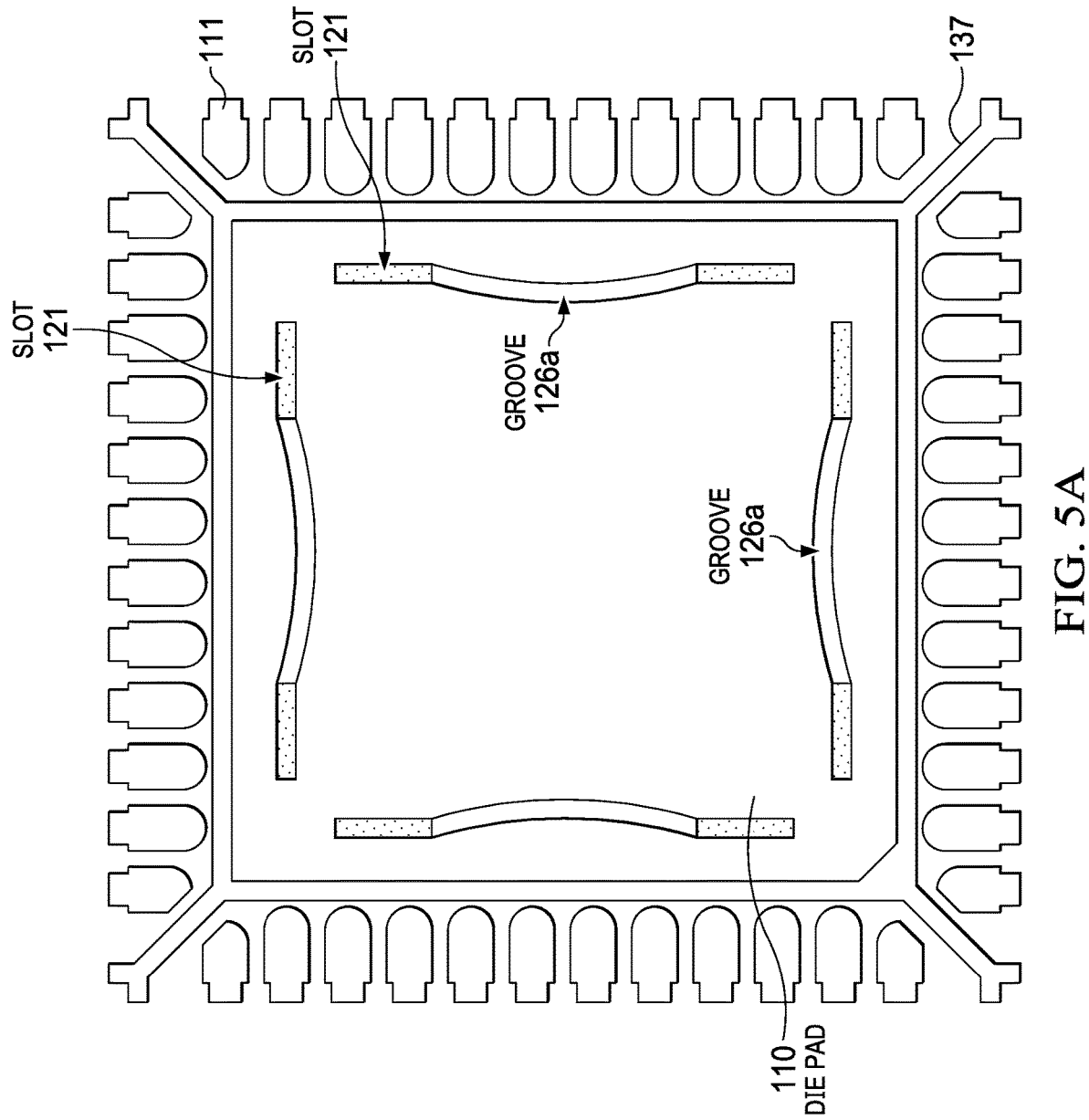
FIG. 5A is a top view that shows a disclosed leadframe having convex grooves between the slots.
Figure 5B:
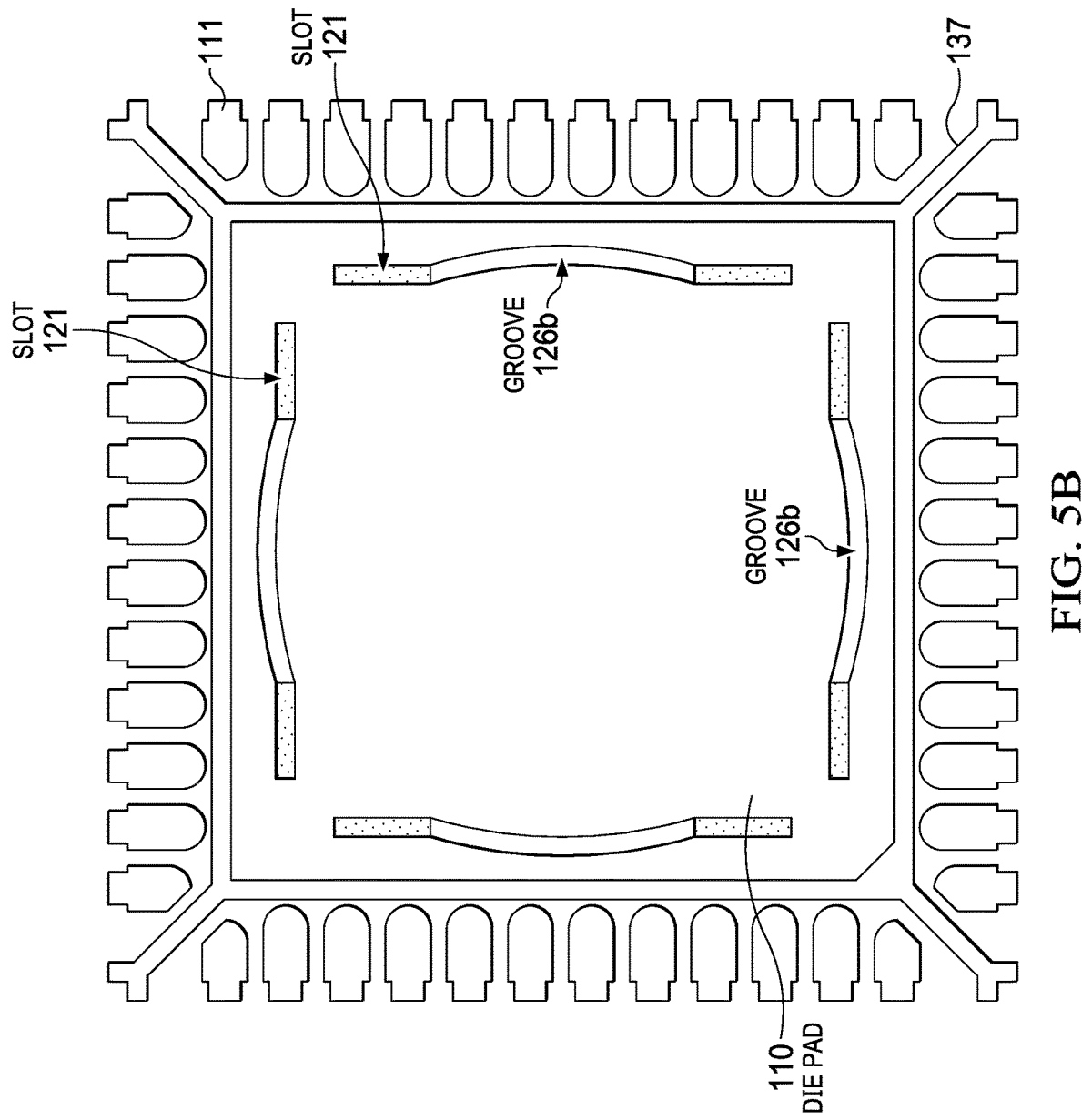
FIG. 5B is a top view that shows a disclosed leadframe having concave grooves between the slots.
Figure 5C:
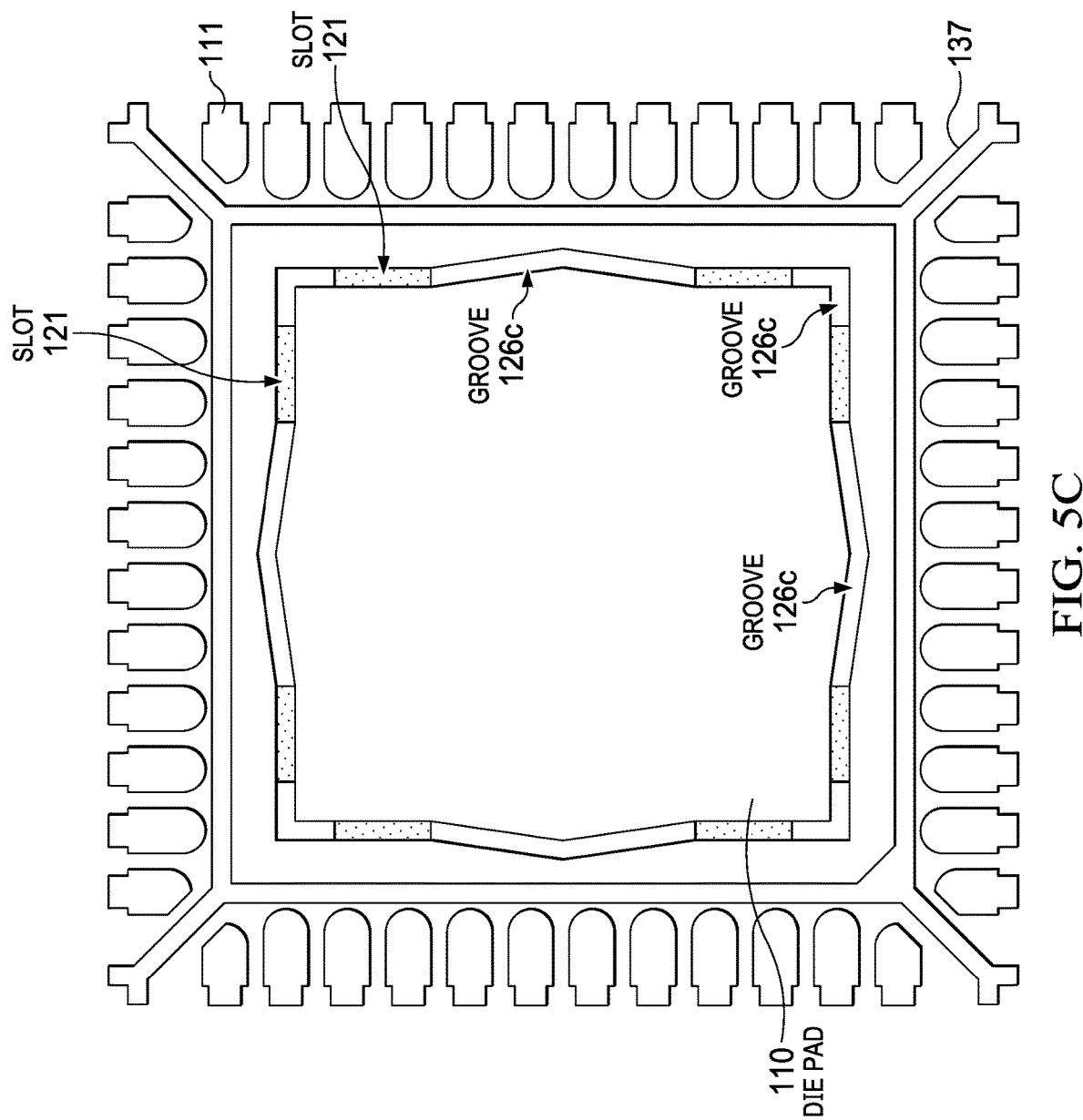
FIG. 5C is a top view that shows a disclosed leadframe having angled grooves between the slots and on the corner of die pad.

Disclosed grooves 126 can be shaped convex, concave, or angled as shown in FIGS. 5A-5C described below. The grooves 126 may also be straight to be analogous to those on existing leadframe designs, as long as there is a slot 121 on both sides of the groove 126. The groove 126, whatever its shape, is located to fluidically connect two surrounding slots 121. The groove 126 shape may depend on the mount pad requirement as the convex shape may be used, but is not limited for use on minimal bonding space to accommodate many down bonds, a concave shape may be applied on device with a large die to pad area ratio, while the angled groove can be similar as that of convex or concave shape and used on die pad corners.

FIG. 5A is a top view that shows a disclosed leadframe having convex grooves 126a between slots 121. FIG. 5B is a top view that shows a disclosed leadframe having concave grooves 126b between slots 121. FIG. 5C is a top view that shows a disclosed leadframe having angled grooves 126c between slots 121 and the corners of the die pad 110.

Figure 6:
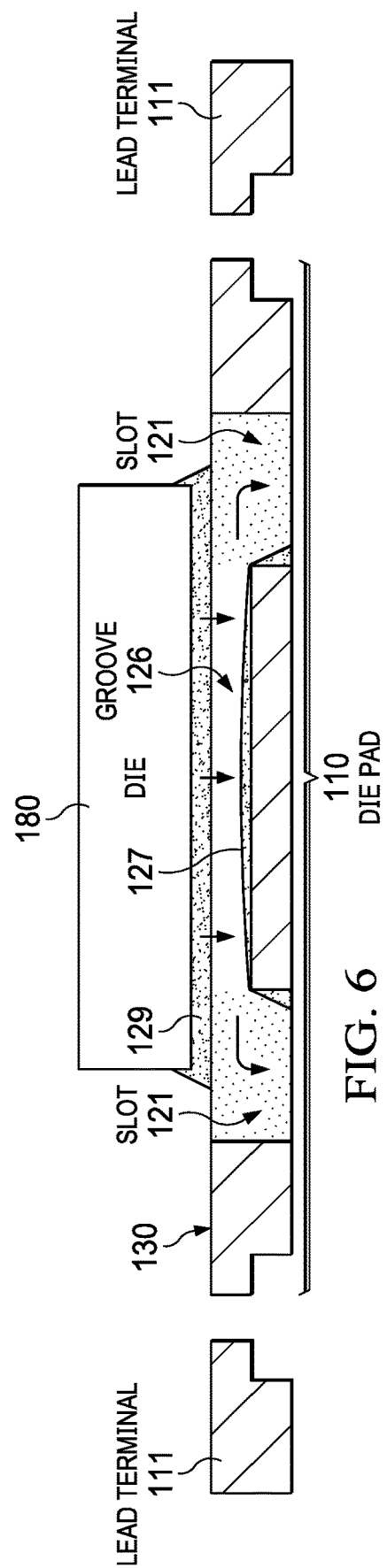
FIG. 6 is a diagram along the cut-line A-A' that further includes a semiconductor attached to a die pad by a die attach resin material, depicting the flow of resin to the groove through the downward arrow and further downward to a through-hole slot towards the bottom of the die pad depicted by the bent arrows.

FIG. 6 is a diagram along the cut-line A-A' that further includes a semiconductor die 180 attached to a die pad 110 by a die attached resin material 129, depicting the flow of resin to the groove 126 through the downward pointing arrows and further downward to a slot 121 towards the bottom of the die pad 110 depicted by the bent arrow. From the mounted die edge, resin bleed-out moves 127 and reaches the nearest side of the groove 126. The resin bleed-out 127 then falls to the bottom of the groove 126 as represented by the downward pointing arrows. As the bottom of the groove 126 becomes saturated with resin bleed-out 127, gravity works and forces part of the resin bleed-out 127 towards the slot 121. This direction of flow of the resin bleed-out 127 towards the slot 121 is shown by the bent arrows with a 90 degree turn. With this resin bleed-out flow arrangement, the bottom of the groove 126 does not get saturated with resin bleed-out 127 that prevents the resin bleed-out 127 from climbing to the other side of the groove 126 and eventually reaching the down bond region 130.

A method of forming disclosed leadframes is also disclosed. A leadframe is provided having a die pad for mounting a semiconductor die top side up using a die attach adhesive resin material that has leads or leads terminals beyond the die pad. Slots are formed including at least a first slot and a second slot on at least a first side of the die pad that penetrate a full thickness of the die pad. As described above, slots can be formed by an etching or a stamping process. At least one non-penetrating groove is formed in the die pad providing a fluid connection between the first and second slots for providing a flow channel for guiding resin when received after resin bleed-out out from under the semiconductor die to flow to at least one of the first and second slots. As described above grooves can also be formed using an etching or a stamping process.

Advantage of disclosed leadframes include a more robust epoxy bleed-out trapper over current available engineering designs. The introduction of grooves between full slots prevents the resin bleed to go beyond the groove towards any down bond region. This Disclosure is applicable not only to QFN packages but generally to all package types, especially those using a maximum die size die relative to the die pad with down bonds.

Disclosed aspects can be integrated into a variety of assembly flows to form a variety of different semiconductor integrated circuit (IC) devices and related products. The assembly can comprise single semiconductor die or multiple semiconductor die, such as PoP configurations comprising a plurality of stacked semiconductor die, or laterally arranged die each having a disclosed die pad with grooves and slots. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including but not limited to bipolar, insulated-gate bipolar transistor (IGBT), CMOS, BiCMOS and MEMS.

Examples

Disclosed aspects are further illustrated by the following specific Examples, which should not be construed as limiting the scope or content of this Disclosure in any way.

Assembly yield can be improved on existing production materials already seen that have had resin bleed-out issues including essentially eliminating scrap due to units lacking proper down bond electrical connections for grounding. Disclosed die pads designs can also eliminate essentially all machine stops attributed to resin bleed-out. For the tested units the die attach material was a silver epoxy, and the package was a 48 pin QFN package. The die size was 3.5 mm×3.1 mm on a die pad having a size of 4.7 mm×4.7 mm, with the packaged device having 3 down bonds over 1 groove on each of its 4 sides.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A leadframe, comprising:
    a die pad for mounting a semiconductor die with its top side facing up using a die attach material including a resin, the leadframe having leads or leads terminals beyond the die pad, the die pad comprising:
        slots including a first slot and at least a second slot on at least a first side of the die pad that penetrate a full thickness of the die pad, and
        at least one non-penetrating groove in the die pad providing a fluid connection including between the first and second slots for providing a flow channel for guiding the resin when received by the grooves after bleeding out from under the semiconductor die to flow to at least one of the first slot and the second slot.

2. The leadframe of claim 1, wherein the grooves are shaped straight, convex, concave, or are angled.

3. The leadframe of claim 1, wherein the leadframe comprises a leadless leadframe.

4. The leadframe of claim 1, wherein the leadframe comprises a leaded leadframe.

5. The leadframe of claim 1, wherein the slots including the first slot and at least the second slot are on all sides of the leadframe.

6. The leadframe of claim 1, wherein the groove has a thickness of 20% to 80% of a nominal thickness of the leadframe.

7. The leadframe of claim 1, wherein the die pad is the same thickness as other portions of the leadframe.

8. An integrated circuit (IC) package, comprising:
    a semiconductor die having a top side with active circuitry and bond pads;
    a leadframe including a die pad having a die attach resin material including a resin mounting the semiconductor die top side up, the leadframe having leads or leads terminals beyond the die pad, the die pad comprising:
  slots including at least a first slot and a second slot on at least a first side of the die pad that penetrate a full thickness of the die pad;
  at least one non-penetrating groove in the die pad providing a fluid connection between the first and second slots for providing a flow channel for guiding the resin when received after bleeding out from under the semiconductor die to flow to at least one of the first and second slots;
  bond wires between some of the bond pads of the semiconductor die and the leads and lead terminals, and
  a mold compound covering the semiconductor die the bond wires and at least a portion of the leadframe.

9. The IC package of claim 8, wherein a bottom side of the die pad is exposed from the mold compound.

10. The IC package of claim 8, wherein the grooves are shaped straight, convex, concave, or are angled.

11. The IC package of claim 8, wherein the slots including the first slot and at least the second slot are on all sides of the leadframe.

12. The IC package of claim 8, wherein the groove has a thickness of 20% to 80% of a nominal thickness of the leadframe.

13. The IC package of claim 8, wherein the die pad is the same thickness as other portions of the leadframe.

14. A method of forming leadframes, comprising:
  providing a leadframe having a die pad for mounting a semiconductor die top side up using a die attach material including a resin, the leadframe having leads or leads terminals beyond the die pad;
  forming slots including at least a first slot and a second slot on at least a first side of the die pad that penetrate a full thickness of the die pad;
  feinting at least one non-penetrating groove in the die pad providing a fluid connecting between the first and second slots for providing a flow channel for guiding the resin when received after bleeding out from under the semiconductor die to flow to at least one of the first and second slots.

15. The method of claim 14, wherein a bottom side of the die pad is exposed from the mold compound.

16. The method of claim 14, wherein the groove has a thickness of 20% to 80% of a nominal thickness of the leadframe.

17. The method of claim 14, wherein the grooves are shaped straight, convex, concave, or are angled.

18. The method of claim 14, wherein the die pad is the same thickness as other portions of the leadframe.

19. A method of forming a packaged semiconductor device, comprising:
  providing a leadframe comprising a die pad for mounting a semiconductor die that has a top side with active circuitry and bond pads, the leadframe having leads or leads terminals beyond the die pad, the die pad comprising slots including a first slot and at least a second slot on at least a first side of the die pad that penetrate a full thickness of the die pad;
  at least one non-penetrating groove in the die pad providing a fluid connection including between the first and second slots for providing a flow channel for guiding the resin when received by the grooves after bleeding out from under the semiconductor die to flow to at least one of the first slot and the second slot;
  attaching the semiconductor die top side up on the die pad using a die attach resin material;
  placing bond wires between some of the bond pads of the semiconductor die and the leads and lead terminals and between at least one of the bond pads to a bonding site located between an outer edge of the semiconductor die and the groove and the slots; and
  covering the semiconductor die, the bond wires and at least a portion of the leadframe with a mold compound.

20. The method of claim 19, wherein the groove has a thickness of 20% to 80% of a nominal thickness of the leadframe.

21. The method of claim 19, wherein the grooves are shaped straight, convex, concave or are angled.

22. The method of claim 19, wherein the slots including the first slot and at least the second slot are on all, sides of the leadframe.

23. The method of claim 19, wherein the molding results in a bottom side of the die pad being exposed from the mold compound.

24. The method of claim 19, wherein the die pad is the same thickness as other portions of the leadframe.

* * * * *